United States Patent [19]

Park

[11] Patent Number: 5,536,679

[45] Date of Patent: Jul. 16, 1996

[54] METHOD FOR FABRICATION OF SEMICONDUCTOR DEVICE CAPABLE OF PREVENTING SHORT CIRCUITS

[75] Inventor: Sang H. Park, Kyoungki-do, Rep. of Korea

[73] Assignee: Hyundai Electronics Industries Co., Ltd., Rep. of Korea

[21] Appl. No.: 383,189

[22] Filed: Feb. 3, 1995

[30] Foreign Application Priority Data

Feb. 3, 1994 [KR] Rep. of Korea ............... 94-1957

[51] Int. Cl.⁶ ............................................. H01L 21/44
[52] U.S. Cl. .................. 437/187; 437/203; 437/235; 437/968; 437/923; 437/90
[58] Field of Search .......................... 437/187, 968, 437/235, 236, 203, 191, 193, 90, 923

[56] References Cited

U.S. PATENT DOCUMENTS 5,124,276  6/1992  Samata et al. .................. 437/89

FOREIGN PATENT DOCUMENTS 56-85840  7/1981  Japan .
3-200318  9/1991  Japan .

*Primary Examiner*—George Fourson
*Assistant Examiner*—C. Everhart
*Attorney, Agent, or Firm*—Merchant, Gould, Smith, Edell, Weller & Schmidt

[57] ABSTRACT

There is disclosed a method for the fabrication of semiconductor device. A problem of short circuit that a metal wiring comes into contact with an area of a silicon substrate which area, when a contact hole is formed, is exposed due to misalignment of the metal wiring mask can be prevented by formation of an oxide layer in a lower area of the contact hole. The method comprises the steps of: forming a field oxide layer on a predetermined area of a silicon substrate; forming a conductive layer pattern in such a way that it overlaps with the filed oxide layer, the conductive layer pattern insulated from the silicon substrate; forming a blanket interlayer insulation film over the resulting structure; etching a contact region of the interlayer insulation film, to form a contact hole which exposes an area of the conductive layer pattern, an area of the field oxide layer being etched owing to misalignment of the contact mask and an area of the silicon substrate being exposed through the contact hole; selectively depositing an epitaxial single crystal silicon on the exposed area of the silicon substrate; oxidizing the epitaxial single crystal silicon at a predetermined thickness, to form an oxide layer; and forming a metal wiring which is electrically connected with the conductive layer pattern and electrically insulated from the silicon substrate.

5 Claims, 3 Drawing Sheets

METHOD FOR FABRICATION OF SEMICONDUCTOR DEVICE CAPABLE OF PREVENTING SHORT CIRCUITS

BACKGROUND OF THE INVENTION

1. Field of the Invention

The present invention relates, in general, to a method for the fabrication of semiconductor device and, more particularly, to prevention of a short circuit between a silicon substrate and a metal wiring, which may occur when the metal wiring comes into contact with a conductive wiring.

2. Description of the Prior Art

High integration of DRAM cell requires that patterns be as fine as possible, and therefore, the process margin becomes reduced of minimum degree upon layout. Accordingly, there is great difficulty in the alignment for, inter alia, fine contacts.

In order to better understand the background of the present invention, a conventional semiconductor memory device will be generally described, along with its fabrication process, in connection with some figures.

With reference to FIG. 1, there is a layout showing a contact of metal wirings with gate electrode. As shown in this figure, a an extended gate electrode region 4 which constitutes a MOSFET, along with a source region 5 and a drain region 6 comes into contact with a metal wiring 10 at a contact region 20 formed at an edge area of the extended gate electrode region 4. In this layout, there is shown a misalignment that the contact region 10 is overlapped with the gate electrode 4, when contact masks are aligned.

Referring to FIG. 2. there is a cross section illustration a prior technique for forming a contact of metal wiring, taken generally through line I—I of FIG. 1. For the contact according to the prior technique a field oxide layer 2 is first formed on an area of a silicon substrate 1 and then, a gate oxide layer 3 is grown on an active region of the silicon substrate. Thereafter, a gate electrode 4 is formed on the gate oxide layer 3 in such a way that it should extent over, overlapping with the field oxide layer 2. Subsequently, a blanket interlayer insulation film 7 is deposited over the resulting structure. Thereafter, the interlayer insulation film 7 is subjected to selective etch by means of a contact mask to form a contact hole, followed by formation of a metal wiring 10.

It should be noted that the field oxide is exposed by a misalignment of the contact mask and thus, etched upon the selective etch. As a result, the contact hole formed exposes the silicon substrate, which causes the metal wiring to come into undesired contact with the silicon substrate. Consequently, the resulting semiconductor device fabricated by the prior technique becomes defective.

SUMMARY OF THE INVENTION

Therefore, an object of the present invention is to overcome the problems encountered in prior arts and to provide a method or the fabrication of semiconductor device, preventive of contact of metal wirings with a silicon substrate.

In accordance with the present invention, the above object could be accomplished by a method of the fabrication of semiconductor device, comprising the steps of: forming a field oxide layer on a predetermined area of a silicon substrate; forming a conductive layer pattern in such a way that it overlaps with the filed oxide layer, said conductive layer pattern insulated from the silicon substrate; forming a blanket interlayer insulation film over the resulting structure; etching a contact region of the interlayer insulation film, to form a contact hole which exposes an area of the conductive layer pattern, an area of the field oxide layer being etched owing to misalignment of the contact mask and an area of said silicon substrate being exposed through said contact hole; selectively depositing an epitaxial single crystal silicon on the exposed area of the silicon substrate; oxidizing the epitaxial single crystal silicon at a predetermined thickness, to form an oxide layer; and forming a metal wiring which is electrically connected with the conductive layer pattern and electrically insulated from the silicon substrate.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Figure 1:
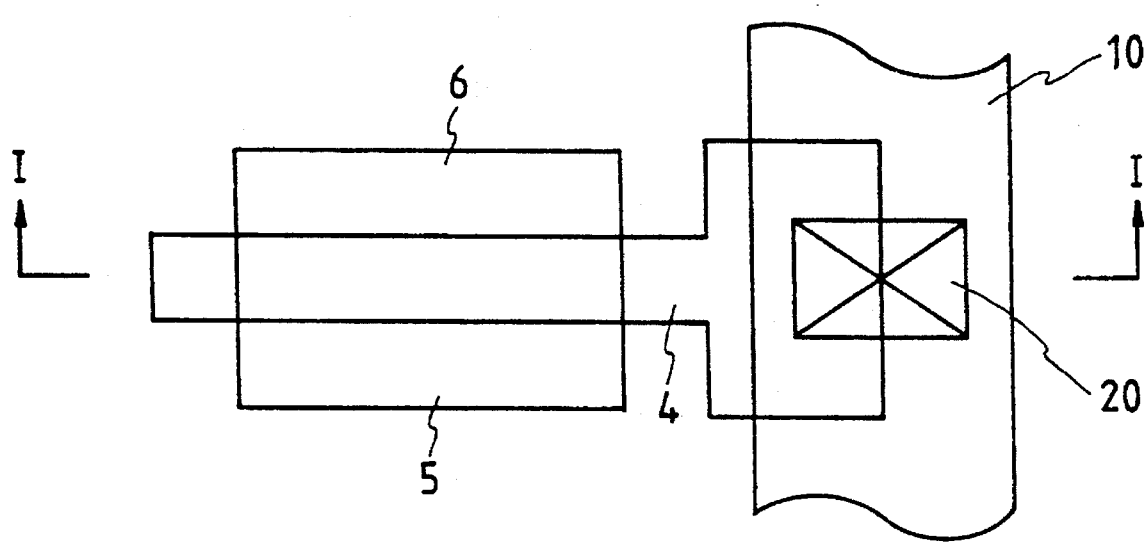
FIG. 1 is a schematic layout showing a contact of metal wirings with gate electrode in a semiconductor device.
Figure 2:
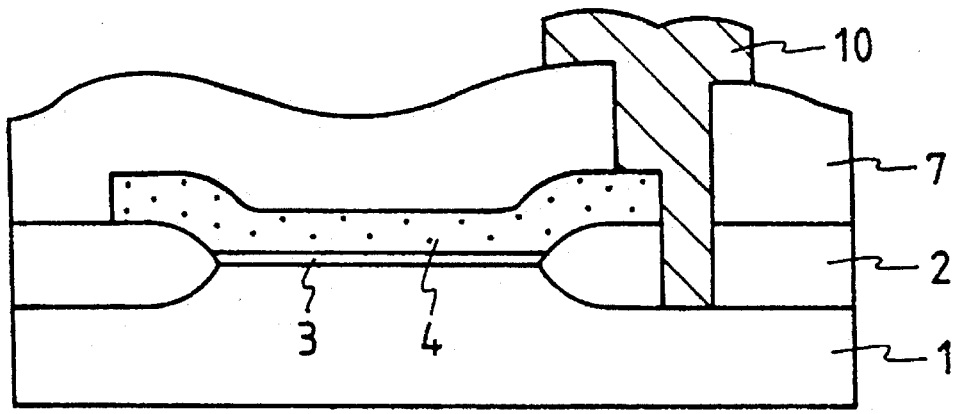
FIG. 2 is a schematic cross sectional views illustrating a conventional method for the fabrication of semiconductor device, taken generally through line I—I of FIG. 1.

The application of the preferred embodiments of the present invention is best understood with reference to the accompanying drawings, wherein like reference numerals are used for like and corresponding pairs, respectively.

Figure 3:
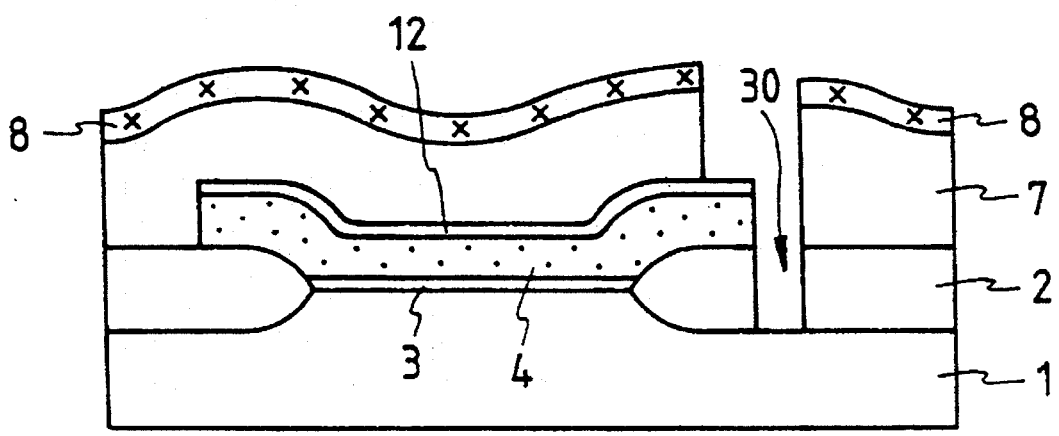
FIGS. 3 through 5 are schematic cross sectional views illustrating a method for the fabrication of semiconductor device according to the present invention, taken generally through line I—I of FIG. 1.
Figure 4:
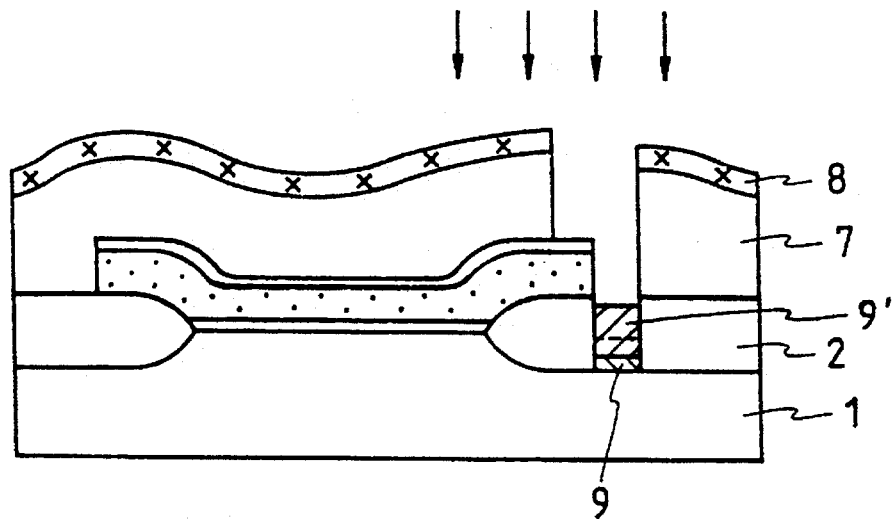
Figure 5:
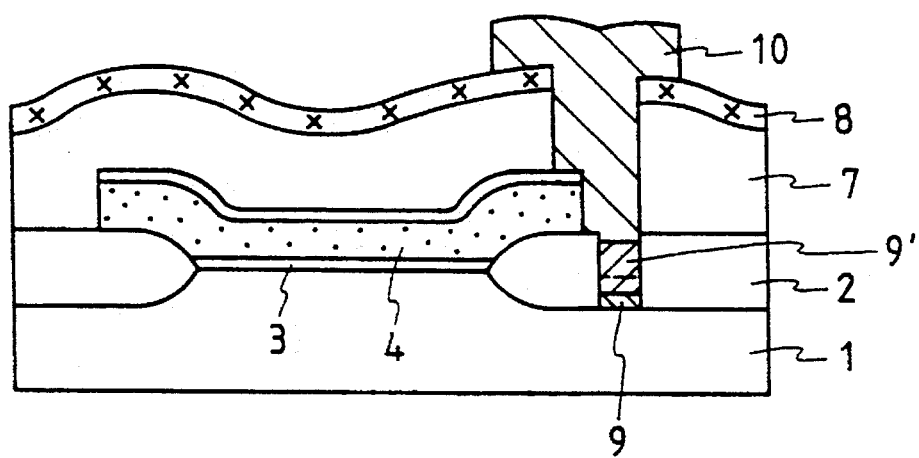

Referring to FIGS. 3 to 5, there is illustrated a method of the present invention for forming a metal wiring in a contact hole in the state that a misalignment is generated.

First, FIG. 3 is a cross section, taken generally through ling I—I of FIG. 1, after a contact hole is formed with a misalignment. For the contact hole, a field oxide layer 2 is initially formed on a predetermined area of a silicon substrate 1 and then, a gate oxide layer 3 is grown on an active region of the silicon substrate 1. Thereafter, a gate electrode 4 capped with a silicide layer 12 is formed on the gate electrode 4 capped with a silicide layer 12 extent over, overlapping with the field oxide layer 2. Subsequently, a blanket interlayer insulation film 7 is deposited over the resulting structure, followed by formation of a nitride film 8 with a thickness of about 100 to 1000 Angstrom on the interlayer insulation film 7, both these films different in etch selectivity from each other. Following this, the nitride film 8 and the interlayer insulation film 7 are subjected to selective etching by means of a contact mask, to form a contact hole 30. The field oxide layer 2 is exposed by a misalignment of the contact mask and thus, etched upon the selective etch. As a result, an area of the silicon substrate 2 is exposed by the contact hole 30. By reference, the silicide layer 12 is to reduce the electrical resistance of the gate electrode 4 and its absence does not matter.

FIG. 4 is a cross section after an epitaxial single crystal silicon 9 is selectively deposited on the area of the silicon substrate 1 which is exposed through the contact hole 30, followed by filling of an oxide layer 9' up to the surface of the field oxide layer 2. The oxide layer 9' is formed by implanting oxygen atoms, as indicated by arrows, into the epitaxial single crystal silicon 9.

FIG. 5 is a cross section after a metal layer, for example, aluminum is deposited in such a way to fill the contact hole 30, followed by etch of the metal layer by use of a mask, to form a metal wiring 10.

In according to the present invention, the formation of the nitride film 8 on the interlayer insulation film 7 may be omitted.

As described hereinbefore, the problem of short circuit that a metal wiring comes into contact with an area of a silicon substrate which area, when a contact hole is formed, is exposed due to misalignment of the metal wiring mask can be prevented by formation of an oxide layer in a lower area of the contact hole.

Other features, advantages and embodiments of the invention disclosed herein will be readily apparent to those exercising ordinary skill after reading the foregoing disclosure. In this regard, while specific embodiments of the invention have been described in considerable detail, variations and modification of these embodiments can be effected without departing from the spirit and scope of the invention as described and claimed,

What is claimed is:

1. A method for the fabrication of semiconductor device, comprising the steps of:

forming a field oxide layer on an area of a silicon substrate;

forming a conductive layer pattern in such a way that it overlaps with the field oxide layer, said conductive layer pattern being insulated from the silicon substrate;

forming a blanket interlayer insulation film over the resulting structure;

etching a contact region of the interlayer insulation film using a contact mask, to form a contact hole which exposes an area of the conductive layer pattern, an area of the field oxide layer being etched owing to misalignment of the contact mask, an area of said silicon substrate being exposed through said contact hole;

selectively depositing an epitaxial single crystal silicon on the exposed area of the silicon substrate;

oxidizing at least a portion of the epitaxial single crystal silicon to form an oxide layer; and forming a metal wiring which is electrically connected with the exposed area of the conductive layer pattern and electrically insulated from the silicon substrate.

2. A method in accordance with claim 1, wherein said conductive layer pattern is a gate electrode.

3. A method in accordance with claim 1, wherein said contact hole is formed after a film which is different in etch selectivity from the interlayer insulation film is deposited.

4. A method in accordance with claim 1, wherein said epitaxial single crystal silicon is oxidized by ion-implantation of oxygen atoms.

5. A method in accordance with claim 1, wherein said conductive layer pattern is capped with a silicide layer.

* * * * *